(12) United States Patent
Bauchspies

(10) Patent No.: US 7,697,773 B1
(45) Date of Patent: Apr. 13, 2010

(54) SYSTEM, METHOD AND COMPUTER PROGRAM PRODUCT FOR IMAGE COMPRESSION/DECOMPRESSION

(75) Inventor: Roger A. Bauchspies, 3182 Campus Dr., 162, San Mateo, CA (US) 94403

(73) Assignee: Roger A. Bauchspies, San Mateo, CA (US)

( * ) Notice: Subject to any disclaimer, the term of this patent is extended or adjusted under 35 U.S.C. 154(b) by 1614 days.

(21) Appl. No.: 10/897,965

(22) Filed: Jul. 22, 2004

(51) Int. Cl.
*G06K 9/36* (2006.01)
(52) U.S. Cl. ............................ 382/246; 382/232
(58) Field of Classification Search ............ 382/232, 382/233, 242–247, 124, 125; 341/67; 375/240.3, 375/240.14, 240.25
See application file for complete search history.

(56) References Cited

U.S. PATENT DOCUMENTS 4,573,201 A * 2/1986 Hashiyama et al. ......... 382/242
6,285,789 B1 * 9/2001 Kim .......................... 382/233

\* cited by examiner

*Primary Examiner*—Duy M Dang
(74) *Attorney, Agent, or Firm*—Michael E. Woods

(57) ABSTRACT

Disclosed is an apparatus, method, and computer program product for an image compression/decompression. The method for compressing a data structure having a first plurality of sets of image elements with one or more predetermined relationships among the image elements and among the sets, and includes encoding a first set of the plurality of image elements using a variable-length encoding process; and encoding a second set of the plurality of image elements using a modification to the variable length encoding process that decreases a symbol composition size of the variable length encoding process responsive to the one or more predetermined relationships among the image elements and the sets. The computer program product includes instructions executable by a processing unit, and those instructions perform the compression/decompression as described herein. The system is a compression/decompression apparatus for dynamically determining a probability of symbols used in a variable length encoding based upon previously encoded elements of the data structure.

62 Claims, 6 Drawing Sheets

Figure_1

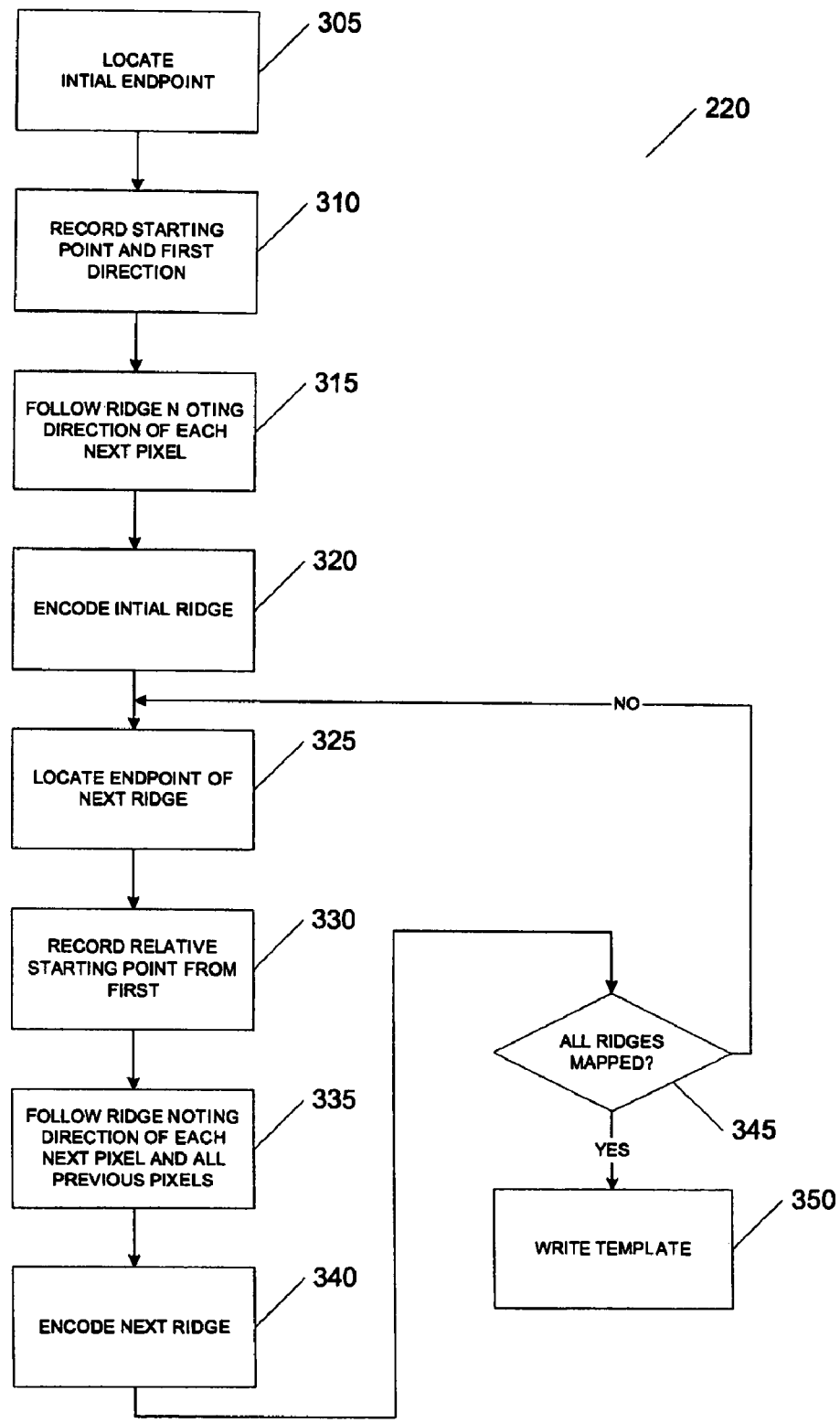
FIGURE_3

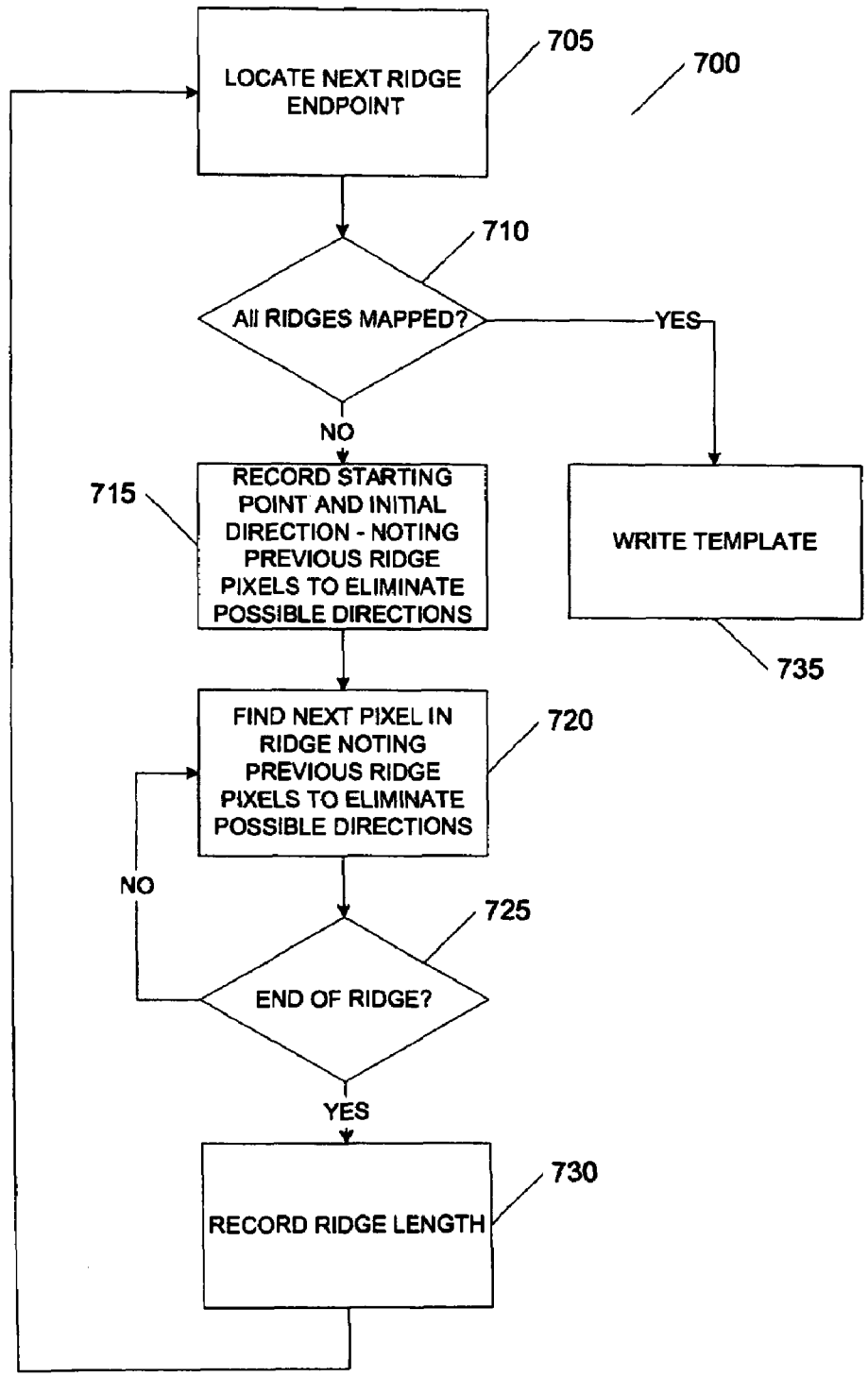
FIGURE_7

SYSTEM, METHOD AND COMPUTER PROGRAM PRODUCT FOR IMAGE COMPRESSION/DECOMPRESSION

CROSS-REFERENCE TO RELATED APPLICATIONS

This patent application is related to co-pending United States patent applications entitled: "SYSTEM, METHOD, AND COMPUTER PROGRAM PRODUCT FOR FINGERPRINT VERIFICATION" having application Ser. No. 10/897,316, and "SYSTEM, METHOD, AND COMPUTER PROGRAM PRODUCT FOR RIDGE MAP FORMATION" having application Ser. No. 10/897,310, both filed on even date and both expressly incorporated by reference in their entireties for all purposes.

BACKGROUND OF THE INVENTION

The present invention relates generally to automatic machine-implemented fingerprint recognition systems, and more specifically to a system, method and computer program product for verifying a fingerprint-under-test against a set of reference fingerprints.

The use of biometrics as an aid to confirming authorization for access to various types of resources or locations has been increasing. Biometric systems measure various unique or nearly unique characteristics of a person's body to assist in confirming identity, and consequently in authorizing an access requested by the person. Common body characteristics used in these systems include fingerprints and eye retinal patterns.

Fingerprints are believed by many to be unique or nearly unique across the population base. Fingerprints include ridges/furrows that define a complex pattern. Each fingerprint typically includes many pattern features (including features referred to as minutia) that are cognizable by detection systems. These minutia serve as the basis by which many fingerprint biometric systems judge a match between a fingerprint-under-test and a reference fingerprint. That is, when the system determines that there is a sufficient match between the fingerprint-under-test and the reference, the system has determined that there are enough matching minutia between the two.

There are two common metrics used to measure how accurate these systems are when comparing the fingerprint-under-test with one or more reference fingerprints. These metrics are a false acceptance ratio (FAR) and a false rejection ratio (FRR). These metrics are dependent upon many factors including the implementation of the sensing system and the type of fingerprint features measured. In general, the FAR and the FRR of conventional systems are inversely related resulting in balancing the performance of these systems, and limiting the practicably achievable accuracy.

Further, processing multitudes of minutia information for multiple fingerprints using conventional systems requires significant processing resources and are often still viewed as taking excessive amounts of time. The significant processing resources needed relegate many solutions to systems that are tethered to desktop computer systems or other substantial processing system. However, there exist many uses for these systems that cannot be used in conjunction with desktop computer systems.

Various systems exist for compression of data to enable the data to be stored using fewer resources (e.g., memory or disk storage) or to enable the data to be transmitted quicker. There are both lossless and lossy systems that may be used based upon characteristics of the implementation. Lossless systems include variable-length encoding systems that, in general application, have a theoretical limit to the degree of compression.

What is needed is a system offering improved image compression and processing efficiency due to reduced size requirements using the often more limited processing resources of a stand-alone or embedded computing platform while desirably being cost-effective.

BRIEF SUMMARY OF THE INVENTION

Disclosed is an apparatus, method, and computer program product for an image compression/decompression. The method for compressing a data structure having a first plurality of sets of image elements with one or more predetermined relationships among the image elements and among the sets, and includes encoding a first set of the plurality of image elements using a variable-length encoding process; and encoding a second set of the plurality of image elements using a modification to the variable length encoding process that decreases a symbol composition size of the variable length encoding process responsive to the one or more predetermined relationships among the image elements and the sets. The computer program product includes instructions executable by a processing unit, and those instructions perform the compression/decompression as described herein. The system is a compression/decompression apparatus for dynamically determining a probability of symbols used in a variable length encoding based upon previously encoded elements of the data structure.

The preferred embodiment of the present invention is a template compression/decompression system, method, and computer program product offering improved image compression and processing efficiency due to reduced size requirements using the often more limited processing resources of a stand-alone or embedded computing platform while desirably being cost-effective.

The novel features which are characteristic of the invention, as to organization and method of operation, together with further objects and advantages thereof, will be better understood from the following description considered in connection with the accompanying drawings in which one or more preferred embodiments of the invention are illustrated by way of example. It is to be expressly understood, however, that the drawings are for the purpose of illustration and description only and are not intended as a definition of the limits of the invention. These drawings include the following figures, with like numerals indicating like parts.

BRIEF DESCRIPTION OF THE DRAWINGS

FIG. 3 is a flow diagram for a preferred embodiment for the template create subprocess shown in FIG. 2;

FIG. 7 is an alternate to template creation step 220 shown in Fig. and FIG. 3.

DETAILED DESCRIPTION OF THE INVENTION

The present invention relates to a system, method, and computer program product offering improved image compression and processing efficiency due to reduced size requirements using the often more limited processing resources of a stand-alone or embedded computing platform while desirably being cost-effective. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

For purposes of the present discussion of a fingerprint verification process in which a fingerprint-under-test is compared against a set of candidate fingerprints, with a comparison signal produced based upon the results of any comparisons, the term fingerprint is taken in its broadest sense. Fingerprint includes a map of contrasting amplitude element and as such, the ridge/furrow pattern on human fingers is included as a fingerprint. Additionally, zebra stripe patterns, retinal vein patterns, or other map of contrasting elements having sufficiently long elements and points of interest coupled to these elements.

Also, to simplify the present discussion, the discussion will emphasize how to make and use, as well as the best mode, of a fingerprint verification engine/process for use in an embedded system. The nature, type and implementation details of the embedded system are not discussed in much detail as the preferred embodiment may be adapted for use in a very wide range of systems. The embedded system determines when to test a fingerprint, when to write/remove reference fingerprints into/from nonvolatile memory, what level of correspondence between a test fingerprint and a reference fingerprint is required, and what happens with a comparison signal produced from the system when a fingerprint matches a particular reference fingerprint. In a simple implementation, the preferred embodiment returns a pass signal (along with a quality signal measuring a correspondence of the match) when a local ridge information of a fingerprint-under-test sufficiently matches corresponding local ridge information of a candidate reference fingerprint.

Figure 1:
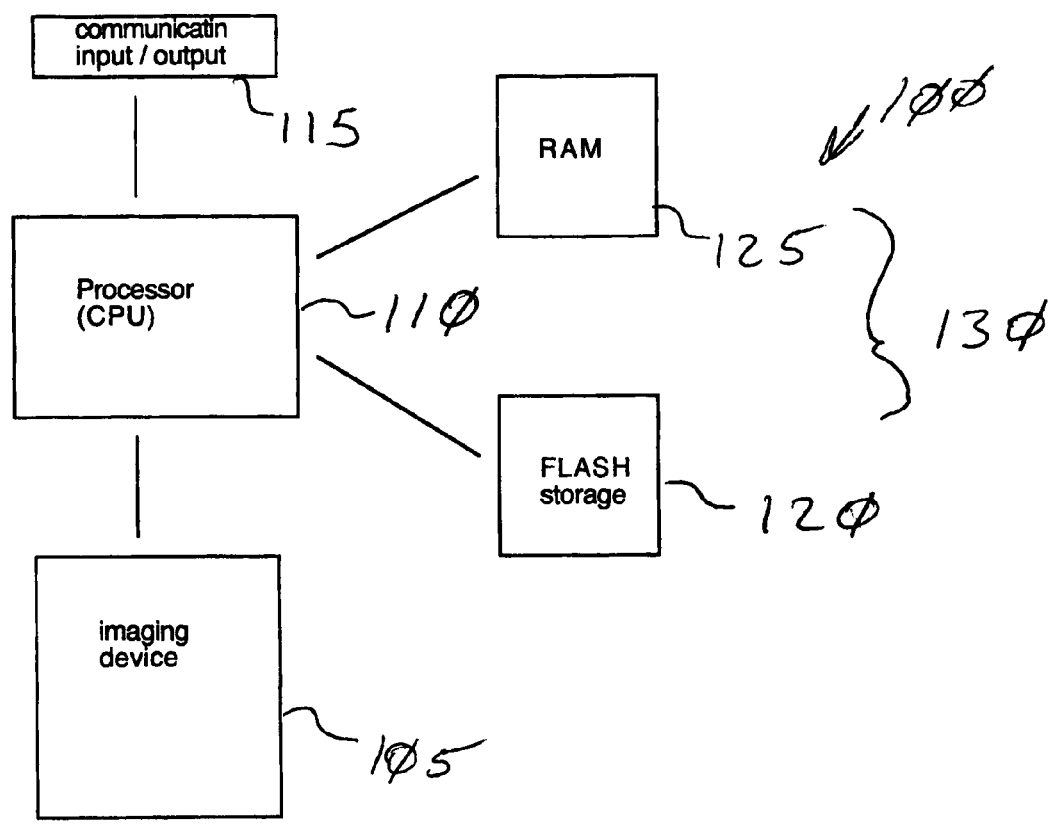
FIG. 1 is a block schematic diagram of a preferred embodiment for a fingerprint verification system.

FIG. 1 is a block schematic diagram of a preferred embodiment for a fingerprint verification system 100. System 100 includes an imaging device 105, a processor 110, an input/output (I/O) system 115, a nonvolatile memory 120 and a RAM memory 125, with memory 120 and memory 125 collectively defining a memory system 130. System 100 is described, in the preferred embodiment, as fingerprint verification system as opposed to other type of fingerprint checking/matching system. In a fingerprint verification system, the system attempts to measure a correspondence between a test fingerprint and reference fingerprints (one-on-one) in order to confirm identify of the test to the reference database. This is contrasted with an identification system that determines which reference the test has been matched to. Typically, a verification system may be used as an identification system if a decrease in power/speed is acceptable, given analogous resources.

System 100 may function as a basic computer in implementing the present invention for accessing and processing fingerprints, fingerprint images, and ridge maps as further described below. Processor 110 may include one or more central processing units (CPUs), such as one of the PC microprocessors or workstations, e.g. RISC System/6000 (RS/6000) (RISC System/6000 is a trademark of International Business Machines Corporation) series available from International Business Machines Corporation (IBM), is provided and interconnected to various other components, such as by a system bus.

Imaging device 105 produces an image of a fingerprint; either directly (i.e., it is a sensor) or it accesses a data structure or memory to obtain the image. The image may be of a reference fingerprint or of a fingerprint-under-test. System 100 is a general purpose computer having a large number of suitable implementations for accessing and processing resources fingerprints, fingerprint images, and ridge maps. Sensors that may be used with system 100 include charge-coupled devices (CCD), complementary metal oxide semiconductor (CMOS), capacitive, or other image sensing devices, such as those available from Fujitsu, Atmel, Athentec, and ST Micro, for example. Image arrays may be relatively small (e.g., 128×128 pixels to a more common CIF size of 352×288 pixels or larger), each pixel having a pixel depth of but not limited to eight bits. System 100 uses a fingerprint image produced from source 105. In some cases, system 105 may preprocess images, such as performing image keystone corrections (a geometric correction used to account for optical distortions associated with optical/prism based systems when returning an image size proportionate to fingerprint size or image stitching to assemble an image taken in bands as a finger is 'swiped' across the sensor.

An operating system runs on processor 10, providing control and coordinating the functions of the various components of the system. The operating system may be one of the commercially available operating systems such as the AIX 6000 operating system or OS/2 operating system available from IBM (AIX 6000 and OS/2 are trademarks of IBM); Microsoft's Windows, Apple's MacOS, as well as UNIX and AIX operating systems, though the preferred embodiment uses a custom control for providing minimal, tailored functions. Custom programs, controlled by the system, are moved into and out of memory. These programs include the program of the present invention to be subsequently described in combination with analyzing and comparing fingerprint-related data. Source 105, I/O communication system 115, and memory system 130 is coupled to processor 110 via a bus and with memory system 130 including a Basic Input/Output System (BIOS) for controlling the basic system functions.

I/O system 115 interconnects system 100 with outside devices or networks, enabling the system to communicate with other such systems over a communications system (e.g., directly wired, Local Area Network (LAN) or Wide Area Network (WAN), which includes, for example, the Internet, the WEB, intranets, extranets, and other public and private networks, wired, optical, or wireless). The terms associated with the communications system are meant to be generally interchangeable and are so used in the present description of the distribution network. I/O devices are also connected to the system bus via I/O system 115. A keyboard, a pointing device (e.g., mouse, trackball or other device) and a display or indicator may be interconnected to system 100 through I/O system 115. It is through such input devices that the user may interactively relate to the programs for manipulating the resources, images, subsystems, processes and system according to the present invention. By using the aforementioned I/O devices, a user is capable of inputting information to the system through the keyboard or mouse and receiving output information from the system. The system may contain a removable memory component for transferring images, maps, instructions or programs.

In use, system 100 compares a live finger to a known database in memory 130. The databases of conventional system typically include one reference from each finger. The preferred embodiment stores multiple references from each finger. When comparing a live finger against the database, system 100 sets the security level higher then for a one to one correspondence and tests the live finger against multiple references from the same finger. System 100 compares reference maps from the same fingerprint against each other using heightened security, and compares maps from one finger against other references supposedly from other fingers to verify that a finger is not referenced multiple times (though each finger has multiple maps).

For example; if two references are stored for a given finger using a false accept rate of 1/2,000, then testing a live finger against the two stored references effectively accomplishes a final false accept rate of 1/1,000.

An advantage in doing so is that the system's false reject rate falls well below a level of other conventional systems, e.g. a 1/100 claimed by many conventional algorithms). Empirically, for example; at a false accept rate of one in 1,000, system 100 has a false reject rate of 1 percent. At a false accept rate of one in 2,000, system 100 has a false reject rate of 1.1 percent. At a false accept rate of one in 10,000 system 100 has a false reject rate of 1.5 percent. At a false accept rate of one in 100,000, system 100 has a false reject rate of 2 percent.

While other algorithms claim a low FRR at the 1/1000 FAR, system 100 maintains a relatively low FRR as FAR goes to 1/10000 to 1/1000000 and beyond, making system 100 operate in a relatively flat portion of a FRR/FAR curve.

System 100 has an advantage not necessarily in processing database statistics, but an advantage in actual use. System 100 stores more templates for each user and sets its test methods to a higher FAR, system 100's ability to successfully match live fingers against stored references is much better than measured statistics and much better than what other conventional algorithms do. It is better than measured statistics partially because known database samples are too limited to test the performance, being established for conventional systems.

Figure 2:
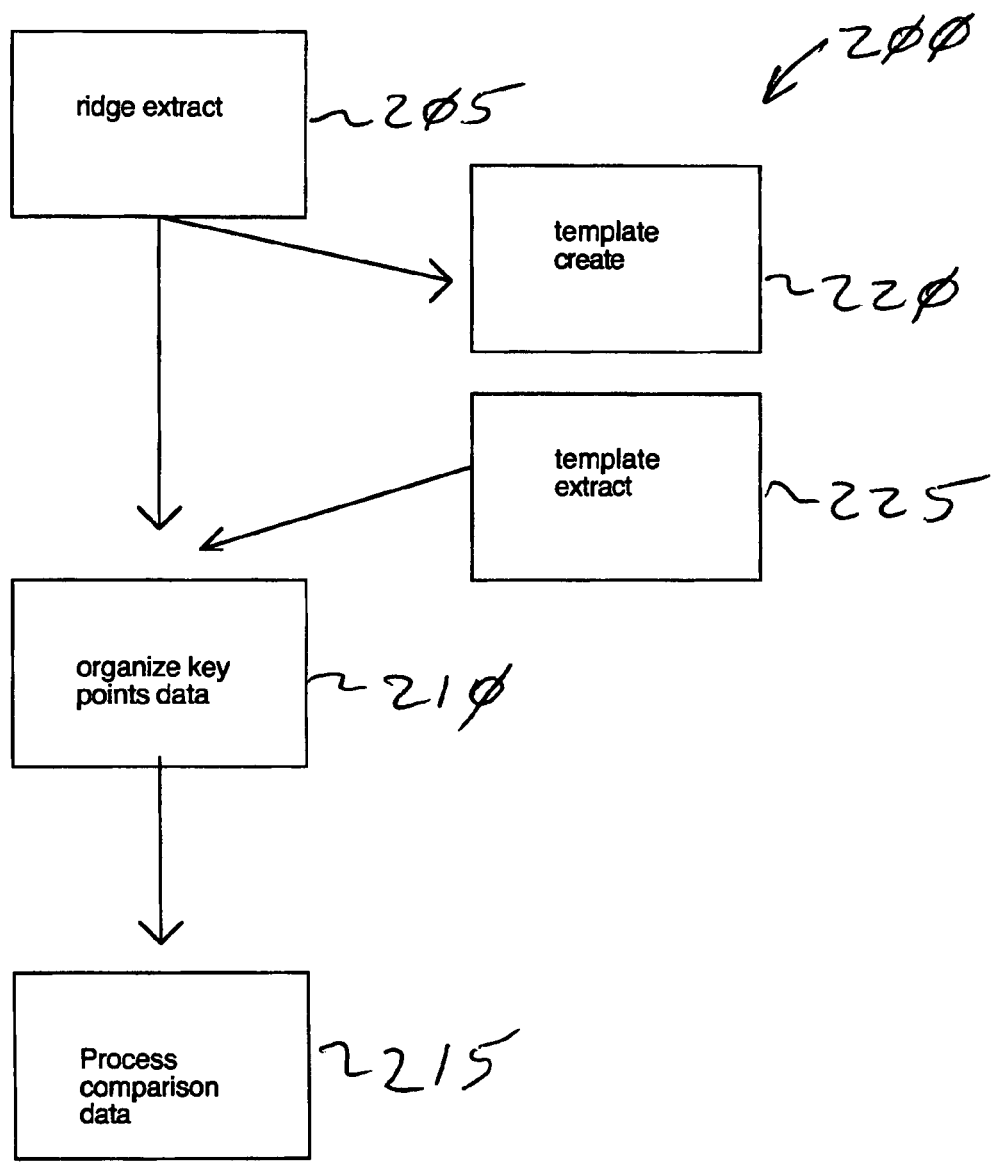
FIG. 2 is a flow diagram of a preferred embodiment for a fingerprint verification process.

FIG. 2 is a flow diagram of a preferred embodiment for a fingerprint verification process 200. Process 200, executed by system 100 for example, includes three main subprocesses: step 205 is a ridge extraction process; step 210 is an organize key points data subprocess following step 205; and step 215 is a compare data subprocess following step 210. Process 200 preferably also includes template processing steps: a template create step 220 and a template extraction step 225.

System 100 uses much of the available ridge data for image comparison. Preparation for comparison is step 205 while actual image verification has two basic steps: organize step 210 and compare step 215.

Ridge extraction step 205 creates a ridge map from an image. There are many ways that an image may be processed to produce the ridge map, some of which are dependent upon the type of sensor, type of image, and resources of system 100. In the preferred embodiment, reference images produced from sensor 105 have ridge maps extracted and templates made from the maps are stored efficiently into memory system 130 as encrypted templates for security and efficient use of memory. When the references are stored as templates, system 100 produces appropriate ridge maps from the templates for use. Reference ridge maps and/or templates from the reference ridge maps are stored in FLASH memory 120 for long term storage, and moved into RAM 125 for processing.

In general, just as one would with an image on a piece of paper, process 205 overlays one image buffer on top of an original image for the extracted ridge data. (the overlay buffer may actually be a multiple of source image. For example: the overlay may be a 2:1 ratio in size.) Step 205 steps across the image array looking for a ridge element to follow. Upon finding a ridge element, step 205 follows it in both directions (most probably the starting point is not a ridge end point). Step 205 "draws" an image of the ridge on the overlay image buffer pixel by pixel. Step 205 repeats stepping across the image array looking for new ridges. The preferred embodiment for step 205 employs a 'ridge following' technique. Many conventional fingerprint systems employ a Fast Fourier Transform (FFT) or other mathematical smoothing model followed by a ridge thinning process. With the ridge following method, step 205 bypasses the processor intensive FFT and the ridge thinning steps.

There are many systems for extracting ridge data from an image. For the preferred embodiment, the ridge extraction is the ridge following process. Details of the ridge following system are disclosed in the related patent application incorporated herein. System 100 uses a ridge following technique because: (a) faster image processing; (b) ability to define ridges with very little ridge to valley definition; (c) eliminates ridge thinning step; and (d) self healing of cracks and gaps.

While the preferred embodiment anticipates that other ridge map formation processes are possible, it is preferable that ridge map formation be compatible between ridge map formation of reference ridge maps and a ridge map from an image of a fingerprint-under-test. It may be that the only sufficiently compatible processing will be achieved using virtually the same mapping for the test image as the reference image(s). However, it may not be a requirement for successful operation for all implementations and embodiments.

FIG. 3 is a flow diagram for a preferred embodiment of the template create subprocess 220 shown in FIG. 2. Subprocess 220 includes two main encoding phases: an initial encoding phase for a first ridge, and encoding of the remaining ridges in a second encoding phase. The initial encoding phase includes step 305 through step 320. Step 325 through step 345 are the remaining ridges encoding phase. These encoding phases produce lossless compression of the ridge map data and produce data with a high degree of entropy which can be further size reduced using any number of variable length encoding algorithms as described herein. Lossless compression includes those techniques guaranteed to generate an exact duplicate of the input data stream after a compress/expand cycle. The lossless compression of images is important in fields such as medical imaging and remote-sensing where data integrity is essential. Popular lossless coding techniques are Huffman, arithmetic and Lempel-Ziv methods. Typically compression ratios for lossless codes on still images vary between expansion and to 4:1 compression.

As well known in the art, variable length encoding systems and methods use a probability distribution of the source where character frequency statistics are used to allocate appropriate codewords for output. For example, Huffman coding is a universal entropy compression method that produces variable length code. Symbols that occur with a high probability are assigned short codewords while symbols that are rare are assigned longer codewords. Optimum performance is achieved when the number of bits used for each character is proportional to the logarithm of the character's probability of occurrence. Huffman coding arranges source probabilities in a descending order, then repeatedly adds the two lowest probabilities, resorting the probabilities, until a tree is generated and one free node is left. Huffman codes have the unique prefix attribute, which means they may be correctly decoded despite their variable length.

In a broad sense, the preferred embodiment uses local context information of processed data that dynamically sets a probability of each pixel-to-pixel transition of each ridge element. Each pixel-to-pixel transition has a maximum set of possible transition values, but the actual set of possible transition values are frequently reduced based upon the previously encoded data and relationships existing between the data elements. In some cases, the probability of a particular pixel-to-pixel transition is one (1). As more data is processed, the distribution, overall, is more and more constrained meaning there are fewer and fewer real possible symbols. The nature and type of probability modification depends upon the type of data, and the predictive/relationship rules that are derived from the data type.

For example, in the preferred embodiment, the present invention is applied to compression of a fingerprint ridge map extracted from an image of a fingerprint produced from a sensor. Knowledge of the extraction parameters and nature of the fingerprint ridge map is important to optimally implement the present invention for any particular implementation. For example, the fingerprint ridge maps used in the preferred embodiment define fingerprint ridges as set forth in detail in the incorporated patent applications. To summarize, the ridge elements are one pixel wide, have a minimum length of about 12-16 pixels, have a minimum separation of about 1 pixels between ridges, a maximum rate of curvature of a ridge element is about 12 degrees/one pixel step, a pixel is immediately adjacent to at most more than two other pixels, and a ridge does not intersect or merge into another ridge (in the preferred embodiment, end-of-ridges are substituted for merging/intersecting ridges)—with many of these values system variables that may be adjusted as necessary or desirable. Of course, other parameters, in addition to or in lieu of, these parameters may be used in other implementations or for other data structures.

Figure 4:
FIG. 4 is an image typical of an output from a fingerprint sensor.

FIG. 4 is an image 400 typical of an output from a fingerprint sensor, and of the type from which system 100 creates a ridge map. Ridge/furrow amplitude information is presented in eight-bit grayscale, with white having a value of "255" and black having a value of "0." Many parts of a ridge element will have values greater than or equal to 0, while furrows will have values less than or equal to 255. The ridge map production is important to both accurately and reproducibly generate ridge maps from fingerprint images. The ridge maps have feature points of interest that are typically endpoints of a ridge element. These features are important in the screening and matching, so reproducibility is important. A preferred embodiment for ridge map production introduces extra feature points of interest, such as when ridge elements merge or intersect, the ridge map will include an endpoint near the point of merger or intersection rather than simply join the ridge element lines.

Figure 5:
FIG. 5 is a ridge map extracted from the image shown in FIG. 4.

FIG. 5 is a ridge map 500 extracted from image 400 shown in FIG. 4. Map 500 is a binary map in which ridges are depicted as black pixels and non-ridges as white pixels. Map 500 is qualified by system 100 to ensure that it contains a sufficient amount of identifiable data in proper proportion to be able to securely use the map for verification. Map 500 may be scaled from the original image size to reduce memory requirements while potentially sacrificing some accuracy. Map 500 is shown at a ratio of 1:1 with image 400.

In FIG. 3, step 305 starts at a reference of the data structure (e.g., the top of an image array/ridge map 500), process 300 steps through the data structure in logical order (e.g., from left to right, top to bottom) until step 305 locates an endpoint of a ridge element. Step 305 counts the steps from the initial reference point until the initial endpoint. An endpoint is located when a ridge pixel is found that has a single nearest neighbor.

During the following discussion, the terms "nearest neighbor" and "pixel-to-pixel transition" are used. To simplify the discussion, these terms are defined in terms of a data structure representing a regular data matrix having a number of regular, parallel, and adjacent rows and columns (though the data matrix is typically not square). In this representation, pixels may be located at any of the locations of the matrix. Any interior location has eight immediately adjacent pixel locations: four diagonal locations and four non-diagonal (e.g., above, below, left, and right). Exterior pixel locations will have fewer than eight. These immediately adjacent possible pixel locations to any reference pixel location are the "nearest neighbors" for this data structure representation. In some implementations, data structures may have a different representation with a different structure that may have more or fewer nearest neighbors, physical or logical.

When at a reference pixel location, there are rules defining the possible (theoretical and/or the actual) directions to valid "nearest neighbor" pixel locations. In other words, when at an endpoint of a ridge element, there are eight nearest neighbors. There are theoretically, for an interior endpoint, eight possible pixel-to-pixel transitions of the ridge element extending from the reference location. For non-endpoint reference pixels, the theoretical maximum number of pixel-to-pixel transitions is dependent upon some of the predetermined relationships (discussed above) among the ridge element pixels of any particular ridge and the pixel location immediately preceding the reference pixel. Without limitation, non-endpoint pixels have a maximum of seven possible directions. If one uses the parameters identified above (except for a maximum path curvature check), then there are a maximum of five possible pixel-to-pixel transitions for a diagonal adjacency between the preceding pixel location and the reference location. There are a maximum of three possible pixel-to-pixel transitions for a non-diagonal adjacency.

When considering the maximum turning radius parameter, there are a maximum of three pixel-to-pixel transitions for both diagonal and non-diagonal adjacency. This information, combined with recognizing that, for ridge elements of a fingerprint, an actual pixel transition direction from a reference location has a highest probability of continuing in the same direction as from the preceding pixel location to the reference location. Using variable length encoding techniques as described earlier, suitable compression of ridge map 500 is possible from these features of the preferred embodiment, which would be equivalent to repeating step 305 through 320 for each ridge element. However, process 300 improves the compression level by use of the second encoding phase for non-initial ridge elements of map 500.

Upon finding an initial endpoint at step 305, process 300 records (at step 310) the number of steps (pixels) traversed to locate the initial endpoint and the direction the ridge element begins, that is, the direction of the second ridge pixel from the initial endpoint (as discussed above, this direction is one of eight choices).

Step 315 follows the ridge element from map 500, noting the difference in direction of each new ridge pixel encountered. Taking into consideration the parameters discussed above, including the maximum curvature radius, there will be a maximum of three choices for each new pixel direction. The total length of each ridge element, and the direction of each pixel-to-pixel transition of the initial ridge element, from the initial endpoint to the last pixel of the ridge element is recorded/encoded at step 320.

Figure 6:
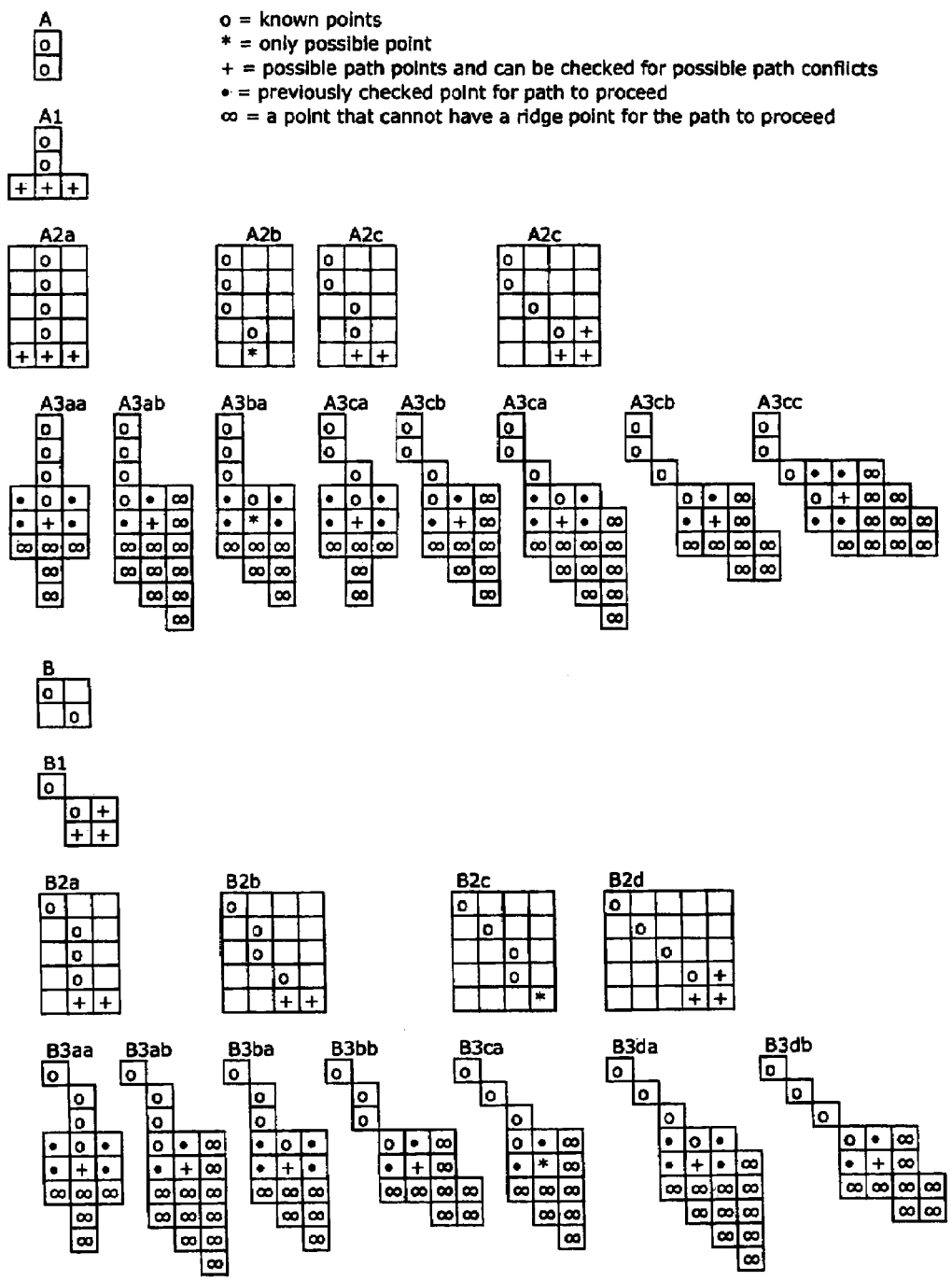
FIG. 6 is a chart illustrating predictive probability reduction of the preferred embodiment.

While there is a maximum of three possibilities for each new pixel direction, there is not always, in fact, three real possibilities. Understanding the data structure and image features, and in conjunction with the characteristics of the data extraction, there is a maximum rate of change possible with each pixel combination found along the ridge. This enables the possibility of data prediction which on average reduces the pixel possibilities to about two. The second phase uses data prediction to reduce the pixel probabilities as shown in FIG. 6, and discussed below.

Similarly to the first phase, process 300 locates an initial endpoint of a next ridge element to be recorded/encoded at step 325 by stepping across the data structure beginning at the last initial endpoint. Step 330 records the next starting point, and direction of the second ridge pixel in the next ridge element.

Step 325 follows the next ridge element from map 500, noting the difference in direction of each new ridge pixel encountered. Taking into consideration the parameters discussed above, including the maximum curvature radius and the prediction shown in FIG. 6, there will be a maximum of three choices for each new pixel direction. The total length of each ridge element, and the direction of each pixel-to-pixel transition of the initial ridge element, from the initial endpoint to the last pixel of the ridge element is recorded/encoded at step 340.

Step 345 tests whether all the ridge elements of map 500 have been recorded/encoded. If there are additional ridge elements to be mapped, process 300 branches back to step 325 from the test at step 345. When all ridge elements have been mapped, process 300 continues to step 350 from step 345. Step 350 writes the template into memory/storage. Decompression of a template to re-create map 500 is straightforward once the details of the particular encoding are known. As well known, the decompression process expands the template in the same order that the ridge elements were recorded and/or encoded. Each recreated ridge assisting in the decompression of subsequent ridge elements as they aided in the prediction for compression.

FIG. 6 is a chart illustrating predictive probability reduction of the preferred embodiment. In FIG. 6, there are two sub-sets of data: drawing points A and B are the basis for the two path possibilities search. Each A and B each occur in four directions accounted for by rotating and mirroring the data shown.

From an endpoint of a ridge, there are eight possible first pixel directions that may be followed. Of the eight first pixel directions, some of them may be discarded by prediction based upon following the ridge path possibilities illustrated. For the pixel path to exist as a possibility, there can be no intersection or too close of an approach with an existing ridge already identified and followed.

Path prediction of the preferred embodiment examines previous pixels on the path. Drawing A1 and B1 show two known points in the path (o) and the possibilities for the next point (+). In each case there are three possible next pixel points. If however, process 300 looks at the four previous pixels as illustrated in the drawings containing the A2 and B2 prefix, the number of next pixel possibilities are reduced as designated by a '+' or a '*'. This prediction required knowledge of the generation of the ridge element. Notice that a designation of '*' illustrates a path with only one possibility which is a fully predicted path pixel. Because the total ridge length is known, a "*" designated pixel transition is actually encoded using no additional bits.

Using the information from the drawings with the A3 and B3 prefix in looking beyond the next pixel to pixels beyond allows even more prediction by determining paths that are not possible if a previously encoded ridge element is located in a location marked with a '∞' or a '•'. Prediction can be done even farther in advance with added complexity. Prediction is as much an exclusion process as it is a prediction process.

Additionally, since the ridge element has a higher probability of continuing in the direction of the last pixel, there is a probability difference with the next pixel. For example, the highest probability of the next pixel of A1 is the first three pixels of A2a and similarly B1 to B2d. A probability difference allows a statistical encoding method such as Huffman or Arithmetic encoding to further reduce the size of the encoded file.

In FIG. 3, it will be appreciated that step 305 through step 320 are essentially the same as step 325 through step 340 except that no prior data is initially detected. FIG. 7 is an alternate to template creation step 220 shown in FIG. 2 and FIG. 3. A template creation process 700 includes a single encoding phase, repeated for each ridge. These cycles, like that shown in FIG. 3, produce lossless compression of the ridge map data and produce data with a low degree of entropy which can be further size reduced using any number of variable length encoding algorithms as described herein.

Process 700 locates an initial point of a next ridge (whether it is the first, second, last or any in between) at step 705. A test, step 710, tests whether an all ridges have been mapped. When all ridges have not been mapped, process 700 performs step 715 through step 730, while process 700 writes the template (step 735) when the test indicates all ridges have been mapped.

Step 715 records the starting point and initial direction, noting any previously mapped ridge pixels or tested potential pixels, to eliminate possible invalid directions. Next, step 720, finds a next pixel in the current ridge (again noting any previously mapped or tested pixels), to eliminate possible invalid directions. Process 700 performs a test, step 725, to determine whether the entire ridge has been mapped. If it has not, process 700 returns to step 720 from step 725. When the entire ridge has been mapped, process 700 records a length of the ridge (step 730) and returns to step 705 to locate an initial point of a next ridge.

Although embodiments of the invention have been described primarily with respect to a fingerprint verification system, any type of fingerprint analysis system may benefit from features of the invention. Other image comparison/processing products such as retinal ID scans, and video edge detection, as well as any continuous path data such as velocity and direction of real objects, for example, may similarly benefit from features of the invention.

One of the preferred implementations of the present invention is as a routine in an operating system made up of programming steps or instructions resident in a memory of a computing system shown in FIG. 1, during computer operations. Until required by the computer system, the program instructions may be stored in another readable medium, e.g. in a disk drive, or in a removable memory, such as an optical disk for use in a CD ROM computer input or in a floppy disk for use in a floppy disk drive computer input. Further, the program instructions may be stored in the memory of another computer prior to use in the system of the present invention and transmitted over a LAN or a WAN, such as the Internet, when required by the user of the present invention. One skilled in the art should appreciate that the processes controlling the present invention are capable of being distributed in the form of computer readable media in a variety of forms.

Any suitable programming language can be used to implement the routines of the present invention including C, C++, C#, Java, assembly language, etc. Different programming techniques can be employed such as procedural or object oriented. The routines can execute on a single processing device or multiple processors. Although the steps, operations or computations may be presented in a specific order, this order may be changed in different embodiments. In some embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A "computer-readable medium" for purposes of embodiments of the present invention may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. Distributed, or networked systems, components and circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

Thus, the scope of the invention is to be determined solely by the appended claims.

What is claimed is:

1. A compression method, using a processor or computing system, for a data structure having a first plurality of sets of image elements with one or more predetermined relationships among the image elements and among the sets, the method comprising:

encoding, using the processor or computing system, a first set of the plurality of image elements using a variable-length encoding process; and encoding, using the processor or computing system, a second set of the plurality of image elements using a modification to said variable length encoding process that decreases a symbol composition size of said variable length encoding process responsive to the one or more predetermined relationships among the image elements and the sets.

2. The compression method of claim 1 wherein the data structure represents a fingerprint ridge map.

3. The compression method of claim 2 wherein the image elements are fingerprint ridge patterns.

4. The compression method of claim 1 wherein the data structure represents a pattern.

5. The compression method of claim 4 wherein said pattern is a contrasting amplitude map.

6. The compression method of claim 4 wherein said map is from a human digit.

7. The compression method of claim 6 wherein said map includes ridge-furrow data.

8. The compression method of claim 3 wherein the fingerprint ridge patterns are have a width.

9. The compression method of claim 4 wherein said width is a single pixel.

10. The compression method of claim 3 wherein the predetermined relationships include a minimum separation between proximate ridges of said fingerprint ridge pattern.

11. The compression method of claim 3 wherein the predetermined relationships include a maximum curvature rate of ridges of said fingerprint ridge pattern.

12. The compression method of claim 3 wherein the predetermined relationships include a ridge pattern wherein any pixel of a particular ridge element is immediately adjacent to at most two other pixels of said particular ridge element.

13. The compression method of claim 12 wherein the predetermined relationships include a minimum separation between proximate ridges of said fingerprint ridge pattern.

14. The compression method of claim 13 wherein said encoding steps encode a total pixel length for each fingerprint ridge.

15. The compression method of claim 13 wherein said encoding steps encode a specific pixel direction from one ridge pixel to an adjacent ridge pixel for pixels in each ridge element, said specific pixel direction selected from a set of possible pixel directions.

16. The compression method of claim 15 wherein said set of possible pixel directions includes at most eight pixel directions for an endpoint pixel and said set of possible pixel directions includes at most five pixel directions for a pixel to immediate pixel transition in a diagonal direction and includes at most three pixel directions for a pixel to immediate pixel transition in a non-diagonal direction.

17. The compression method of claim 15 wherein said second set encoding step encodes pixel to immediate pixel transitions using sets of possible pixel directions having fewer possible direction pixels for a pixel to immediate pixel transition than said first encoding step would have used for encoding the same pixel to immediate pixel transition.

18. The compression method of claim 1 wherein said encoding steps encode a specific pixel direction from one ridge pixel to an adjacent ridge pixel for pixels in each ridge element, said specific pixel direction selected from a set of possible pixel directions.

19. The compression method of claim 18 wherein said set of possible pixel directions includes at most eight pixel directions for an endpoint pixel and said set of possible pixel directions includes at most five pixel directions for a pixel to immediate pixel transition in a diagonal direction and includes at most three pixel directions for a pixel to immediate pixel transition in a non-diagonal direction.

20. The compression method of claim 18 wherein said pixel directions for a ridge pixel transition are selected from one or more sets of possible pixel directions.

21. The compression method of claim 20 wherein said possible pixel directions of a set of possible pixel directions are dependent upon one or more of the one or more predefined relationships.

22. The compression method of claim 21 wherein the one or more predefined relationships include a one or more of a ridge pattern maximum curvature, a minimum ridge length, a ridge length, a maximum ridge thickness, and a minimum ridge separation.

23. The compression method of claim 22 including three sets of possible ridge directions: a first set for an endpoint ridge pixel; a second set for a non-endpoint ridge pixel having a diagonal transition; and a third set for a non-endpoint ridge pixel having a non-diagonal transition.

24. The compression method of claim 23 wherein said first set includes no more than eight possible pixel directions, said second set includes no more than five possible pixel directions, and said third set of possible directions includes no more than three possible pixel directions.

25. The compression method of claim 22 wherein said first set encoding step includes three sets of possible ridge directions: a first set for a first endpoint ridge pixel; a second set for a non-endpoint ridge pixel having a diagonal transition; and a third set for a non-endpoint ridge pixel having a non-diagonal transition.

26. The compression method of claim 25 wherein said second set encoding step includes, for said second set of ridge elements, three sets of possible ridge directions: a fourth set for a second endpoint ridge pixel; a fifth set for a non-endpoint ridge pixel having a diagonal transition; and a sixth set for a non-endpoint ridge pixel having a non-diagonal transition; wherein: a number of possible pixel directions for said fourth set is smaller than said first set; a number of possible pixel directions for said fifth set is smaller than said second set; and a number of possible pixel directions for said sixth set is smaller than said third set.

27. The compression method of claim 18 wherein said ridge pixels are arranged into a regular matrix.

28. The compression method of claim 22 wherein a ridge-pixel to ridge-pixel transition includes one of a diagonal transition and a non-diagonal transition.

29. The compression method of claim 23 wherein said pixel directions for an endpoint pixel are selected from a first set of possible pixel directions.

30. The compression method of claim 29 wherein said pixel directions for a midpoint pixel are selected from one or more sets of possible pixel directions.

31. An apparatus for compressing a data structure having a first plurality of sets of image elements with one or more predetermined relationships among the image elements and among the sets, comprising:

means for encoding a first set of the plurality of image elements using a variable-length encoding process; and means for encoding a second set of the plurality of image elements using a modification to said variable length encoding process that decreases a symbol composition size of said variable length encoding process responsive to the one or more predetermined relationships among the image elements and the sets.

32. A computer program product encoded on a computer readable medium carrying program instructions for compressing a data structure having a first plurality of sets of image elements with one or more predetermined relationships among the image elements and among the sets when executed using a computing system, the executed program instructions executing a method, the method comprising:
 encoding a first set of the plurality of image elements using a variable-length encoding process; and
 encoding a second set of the plurality of image elements using a modification to said variable length encoding process that decreases a symbol composition size of said variable length encoding process responsive to the one or more predetermined relationships among the image elements and the sets.

33. The computer program product of claim 32 wherein the data structure represents a fingerprint ridge map.

34. The computer program product of claim 33 wherein the image elements are fingerprint ridge patterns.

35. The computer program product of claim 32 wherein the data structure represents a pattern.

36. The computer program product of claim 35 wherein said pattern is a contrasting amplitude map.

37. The computer program product of claim 35 wherein said map is from a human digit.

38. The computer program product of claim 37 wherein said map includes ridge-furrow data.

39. The computer program product of claim 34 wherein the fingerprint ridge patterns are have a width.

40. The computer program product of claim 35 wherein said width is a single pixel.

41. The computer program product of claim 34 wherein the predetermined relationships include a minimum separation between proximate ridges of said fingerprint ridge pattern.

42. The computer program product of claim 34 wherein the predetermined relationships include a maximum curvature rate of ridges of said fingerprint ridge pattern.

43. The computer program product of claim 34 wherein the predetermined relationships include a ridge pattern wherein any pixel of a particular ridge element is immediately adjacent to at most two other pixels of said particular ridge element.

44. The computer program product of claim 43 wherein the predetermined relationships include a minimum separation between proximate ridges of said fingerprint ridge pattern.

45. The computer program product of claim 44 wherein said encoding steps encode a total pixel length for each fingerprint ridge.

46. The computer program product of claim 44 wherein said encoding steps encode a specific pixel direction from one ridge pixel to an adjacent ridge pixel for pixels in each ridge element, said specific pixel direction selected from a set of possible pixel directions.

47. The computer program product of claim 46 wherein said set of possible pixel directions includes at most eight pixel directions for an endpoint pixel and said set of possible pixel directions includes at most five pixel directions for a pixel to immediate pixel transition in a diagonal direction and includes at most three pixel directions for a pixel to immediate pixel transition in a non-diagonal direction.

48. The computer program product of claim 46 wherein said second set encoding step encodes pixel to immediate pixel transitions using sets of possible pixel directions having fewer possible direction pixels for a pixel to immediate pixel transition than said first encoding step would have used for encoding the same pixel to immediate pixel transition.

49. The computer program product of claim 32 wherein said encoding steps encode a specific pixel direction from one ridge pixel to an adjacent ridge pixel for pixels in each ridge element, said specific pixel direction selected from a set of possible pixel directions.

50. The computer program product of claim 49 wherein said set of possible pixel directions includes at most eight pixel directions for an endpoint pixel and said set of possible pixel directions includes at most five pixel directions for a pixel to immediate pixel transition in a diagonal direction and includes at most three pixel directions for a pixel to immediate pixel transition in a non-diagonal direction.

51. The computer program product of claim 49 wherein said pixel directions for a ridge pixel transition are selected from one or more sets of possible pixel directions.

52. The computer program product of claim 51 wherein said possible pixel directions of a set of possible pixel directions are dependent upon one or more of the one or more predefined relationships.

53. The computer program product of claim 52 wherein the one or more predefined relationships include a one or more of a ridge pattern maximum curvature, a minimum ridge length, a ridge length, a maximum ridge thickness, and a minimum ridge separation.

54. The computer program product of claim 53 including three sets of possible ridge directions: a first set for an endpoint ridge pixel; a second set for a non-endpoint ridge pixel having a diagonal transition; and a third set for a non-endpoint ridge pixel having a non-diagonal transition.

55. The computer program product of claim 54 wherein said first set includes no more than eight possible pixel directions, said second set includes no more than five possible pixel directions, and said third set of possible directions includes no more than three possible pixel directions.

56. The computer program product of claim 53 wherein said first set encoding step includes three sets of possible ridge directions:
 a first set for a first endpoint ridge pixel; a second set for a non-endpoint ridge pixel having a diagonal transition; and a third set for a non-endpoint ridge pixel having a non-diagonal transition.

57. The computer program product of claim 56 wherein said second set encoding step includes, for said second set of ridge elements, three sets of possible ridge directions: a fourth set for a second endpoint ridge pixel; a fifth set for a non-endpoint ridge pixel having a diagonal transition; and a sixth set for a non-endpoint ridge pixel having a non-diagonal transition; wherein: a number of possible pixel directions for said fourth set is smaller than said first set; a number of possible pixel directions for said fifth set is smaller than said second set; and a number of possible pixel directions for said sixth set is smaller than said third set.

58. The computer program product of claim 49 wherein said ridge pixels are arranged into a regular matrix.

59. The computer program product of claim 53 wherein a ridge-pixel to ridge-pixel transition includes one of a diagonal transition and a non-diagonal transition.

60. The computer program product of claim 54 wherein said pixel directions for an endpoint pixel are selected from a first set of possible pixel directions.

61. The computer program product of claim 60 wherein said pixel directions for a midpoint pixel are selected from one or more sets of possible pixel directions.

62. An apparatus for compressing a data structure having a first plurality of sets of image elements with one or more predetermined relationships among the image elements and among the sets, the apparatus comprising:

a memory; and a processing unit, coupled to said fingerprint source, for:

encoding a first set of the plurality of image elements using a variable-length encoding process; and encoding a second set of the plurality of image elements using a modification to said variable length encoding process that decreases a symbol composition size of said variable length encoding process responsive to the one or more predetermined relationships among the image elements and the sets.

* * * * *